(12) United States Patent
Yun et al.

(10) Patent No.: US 7,723,147 B2
(45) Date of Patent: May 25, 2010

(54) IMAGE SENSOR AND METHOD OF MANUFACTURING THE SAME

(75) Inventors: Young-Je Yun, Gyeonggi-do (KR); Jin-Ho Park, Seoul (KR); Sang-Wook Ryu, Seoul (KR)

(73) Assignee: Dongbu HiTek Co., Ltd., Seoul (KR)

( * ) Notice: Subject to any disclaimer, the term of this patent is extended or adjusted under 35 U.S.C. 154(b) by 212 days.

(21) Appl. No.: 11/950,171

(22) Filed: Dec. 4, 2007

(65) Prior Publication Data

US 2008/0157244 A1 Jul. 3, 2008

(30) Foreign Application Priority Data

Dec. 28, 2006 (KR) .................. 10-2006-0136971

(51) Int. Cl.
*H01L 21/00* (2006.01)
*H01L 31/0232* (2006.01)

(52) U.S. Cl. .................. 438/65; 438/82; 257/432
(58) Field of Classification Search .................. 438/69, 438/70, 65, 82; 257/432–436, E31.127, E27.15–E27.163, 257/E29.227–E29.24
See application file for complete search history.

(56) References Cited

U.S. PATENT DOCUMENTS

| 6,069,350 | A | * | 5/2000 | Ohtsuka et al. | .......... 250/208.1 |
|---|---|---|---|---|---|
| 6,586,811 | B2 | * | 7/2003 | Sekine | .......... 257/432 |
| 7,382,011 | B2 | * | 6/2008 | Noda et al. | .......... 257/292 |
| 2006/0138500 | A1 | | 6/2006 | Kim | |
| 2006/0292734 | A1 | * | 12/2006 | Kim | .......... 438/70 |
| 2007/0001252 | A1 | * | 1/2007 | Noda et al. | .......... 257/432 |
| 2008/0014674 | A1 | * | 1/2008 | Kim | .......... 438/69 |
| 2008/0150054 | A1 | * | 6/2008 | Kim | .......... 257/432 |
| 2008/0158683 | A1 | * | 7/2008 | Yun et al. | .......... 359/620 |

FOREIGN PATENT DOCUMENTS

| CN | 1819220 | 8/2006 |
|---|---|---|
| KR | 2003-0001059 | 6/2003 |

\* cited by examiner

*Primary Examiner*—Calvin Lee
(74) *Attorney, Agent, or Firm*—Sherr & Vaughn, PLLC

(57) ABSTRACT

An image sensor and a method of manufacturing the same capable of improving image quality by preventing the generation of a lens bridge formed due to a mutual connection of neighboring microlenses. The image sensor can include a semiconductor substrate having a plurality of photodiodes formed thereon; an insulation layer formed over the semiconductor substrate; a color filter layer formed over the insulation layer; a planarization layer formed over the whole surface including the color filter layer and having a plularity of concave regions and a convex regions repeatedly arranged in a pixel period; and a microlens formed over each of the concave regions and the convex regions.

18 Claims, 7 Drawing Sheets

IMAGE SENSOR AND METHOD OF MANUFACTURING THE SAME

The present application claims priority under 35 U.S.C. 119 to Korean Patent Application No. 10-2006-0136971 (filed on Dec. 28, 2006), which is hereby incorporated by reference in its entirety.

BACKGROUND

An image sensor is a semiconductor device for converting an optical image into an electrical signal. The image sensor may be classified as a charge coupled device (CCD) and a complementary metal oxide silicon (CMOS) image sensor (CIS).

Such an image sensor may be include a photodiode for sensing irradiated light and a logic circuit unit for processing the sensed light into an electrical signal and concert it into data. The greater capacity the photodiode has for receiving light, the better the photosensitivity characteristics of the image sensor.

In order to enhance such photosensitivity, a technique may be for enlarging a fill factor of the area the photodiode occupies among the entire area of the image sensor or condenses light into the photodiode by changing the optical path incident on the region other than the photodiode.

Such a condensing technique may include forming a microlens. A convex microlens may be formed on and/or over the uppermost surface of the photodiode using material having good light transmittance to refract the path of incident light so that light in greater quantities may be irradiated to the photodiode region. The light horizontal to the optical axis of the microlens may be refracted using the microlens so that the focus thereof is formed at a predetermined position on the optical axis.

An image sensor may include photodiode, an interlayer dielectric layer, a color filter layer, and a micro lens. The photodiode may perform the function of sensing and converting light into an electrical signal. The interlayer dielectric layer may perform the function insulating each metal wiring. The color filter layer can represent three primary colors of light such as red (R), green (G), and blue (B). The microlens may perform the function of condensing light into the photodiode.

Figure 1:
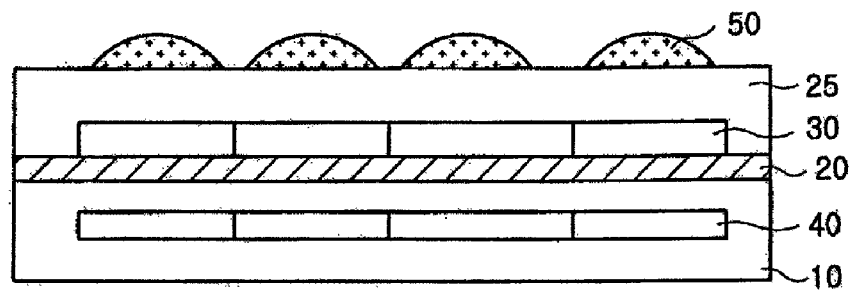

As illustrated in example FIG. 1, an image sensor can include insulating layer 20 formed on and/or over semiconductor substrate 10 formed with a plurality of photodiodes 40. Color filter layers 30 representing red (R), green (G), and blue (B) corresponding to the plurality of photodiodes 40 may be formed on and/or over insulating layer 20. Planarization layer 25 for planarizing the uneven surface layers of color filter layers 30 may be formed on and/or over color filter layers 30.

A plurality if microlenses 50 each corresponding to the plurality of photodiodes 40 and color filter layers 30 may then be formed on and/or over planarization layer 25. Microlenses 50 may be formed in a convex lens pattern for collecting light to photodiodes 40 by patterning microlenses 50 using a photoetching process.

Figure 2A:
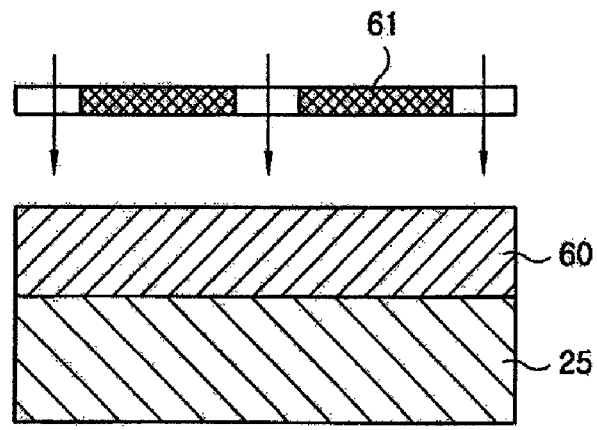

As illustrated in example FIG. 2A, photoresist 60, which is a material for microlens 50, may be coated on and/or over planarization layer 25.

Figure 2B:
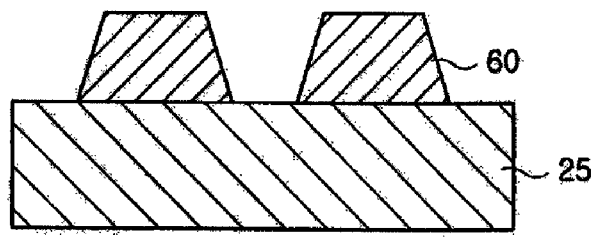

As illustrated in example FIG. 2B, photoresists 60 may then be covered with mask 61 and then subjected to an exposure process using a defocus phenomenon so that photoresist 60 is patterned in a trapezoidal pattern.

Figure 2C:
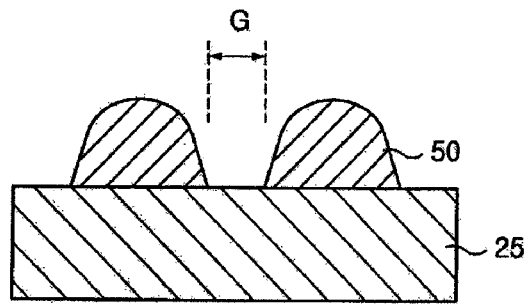

As illustrated in example FIG. 2C, photoresists 60 in a trapezoidal pattern may then be heated up to a melting point and then reflowed. Subjecting to the reflow process, the photoresist pattern has mobility and is rounded so that microlens 50 is completed. Forming microlens 50 in this manner, however, may generate gap (G) between neighboring microlenses 50. In the microlens forming process, the gap between neighboring microlenses may have the largest effect on the performance of the image sensor.

The smaller the gap, the more the light sensitivity of the device is improved, sometimes as much as by 10 to 15% or more. Moreover, as the gap between the microlenses is smaller, a flux amount of light is large and the optical efficiency of light transferred to the lower end of a light diode in the device ma be increased.

In the case of a CMOS type device where a metal wiring may be provided in a pixel region, the light passes through the metal wiring arranged to avoid a path of light from the upper layer to the lower end to decrease the probability of it being scattered.

As described above, a microlens may be formed by a process patterning organic material in a form of a photoresist capable of being reflowed by using thermal energy at the place where the microlens is positioned on a planarization layer or a plane formed of the same material such as an oxide thin film, etc., using a lithographic method and then applying heat to reflow it.

When forming a microlens using such a process, since the width of the gap of the microlens may be determined using the gap of a pattern formed through a photolithographic before reflow, the minimum line width of the gap may be limited to 50 nm due to the limitation of lithographic resolution.

When making the gap of the microlens narrow below 50 nm by making the reflow excessive, since the flow of the microlens is determined using an equilibrium condition between surface tension and the reflow, it may be very difficult to control the generation probability of the lens bridge.

Figure 3:
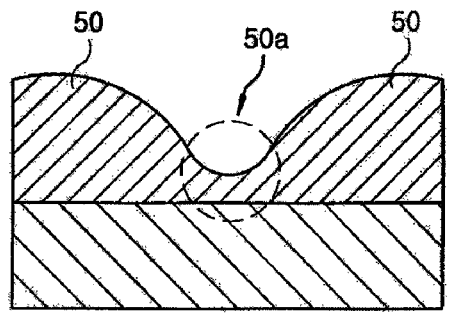

As illustrated in example FIG. 3, formation of a lens bridge may result in a mutual connection of neighboring microlenses. Consequently, it may be impossible to greatly reduce the size or otherwise eliminate the gap between neighboring microlenses.

SUMMARY

Embodiments relate to an image sensor and a method of manufacturing the same capable of improving image quality by preventing a generation of a lens bridge formed due to a mutual connection of neighboring microlenses.

Embodiments relate to an image sensor and a method of manufacturing the same capable of improving image quality by lowering the risk of a lens bridge although a gap between microlenses is narrowly formed below 50 nm.

Embodiments relate to an image sensor that can include: a semiconductor substrate including a plurality of photodiodes; an insulation layer formed over the semiconductor substrate; a color filter layer formed over the insulation layer; a planarization layer having a plurality of alternating concave regions and convex regions in an uppermost surface thereof formed over the color filter layer; and a plurality of microlens formed over the concave regions and the convex regions.

Embodiments relate to a method of manufacturing the image sensor that can include at least one of the following steps: providing a semiconductor substrate having a plurality of photodiodes formed therein; forming an insulating layer over the semiconductor substrate; forming a color filter layer over the insulating layer and corresponding to the plurality of photodiodes; forming a plurality of concave regions and a plurality of convex regions repeatedly arranged in a pixel period over the color filter layer; and then forming a plurality of microlenses over the convex regions and the concave regions.

Embodiments relate to a method of manufacturing the image sensor that can include at least one of the following steps: providing a semiconductor substrate having a plurality of photodiodes formed therein; forming an insulating layer over the semiconductor substrate; forming a color filter layer over the insulating layer and corresponding to the plurality of photodiodes; sequentially forming a first planarization layer over the color filter layer and a second planarization layer over the first planarization layer; patterning the second planarization layer to expose regions of the uppermost surface of the first planarization layer, wherein each one of the exposed regions of the uppermost surface of the first planarization layer includes a concave region and the uppermost surface of the patterned second planarization layer includes a convex region; and then forming a microlens over each one of the convex region and the concave region.

DRAWINGS

Example FIGS. 1 to 3 illustrate an image sensor.
Example FIGS. 4 to 8 illustrate an image sensor, in accordance with embodiments.

DESCRIPTION

Figure 4:
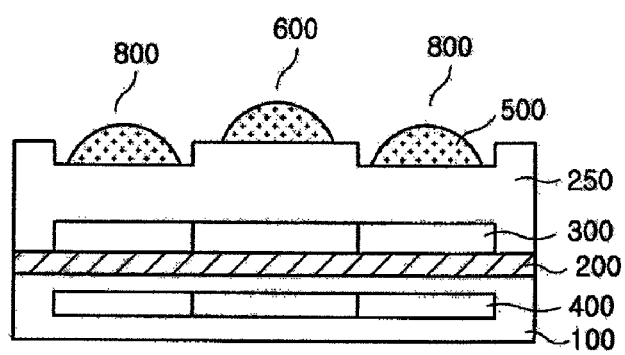

As illustrated in example FIG. 4, an image sensor in accordance with embodiments can include a plurality of photodiodes 400 formed in semiconductor substrate 100. Insulating layer 200 can be formed on and/or over semiconductor substrate 100. A plurality of color filter layers 300 can be formed on and/or over insulating layer 200 and correspond to each of the plurality of photodiodes 400. Color filter layers 300 can include red, blue, and green alternatively formed in a mosaic form.

Planarization layer 250 can be formed on and/or over color filter layers 300. An uppermost surface of planarization layer 250 can include convex region 600 and concave region 800 provided in a constant interval and repeatedly arranged in a pixel period. A plurality of microlenses 500 may be formed on and/or over convex region 600 and concave region 800.

The image sensor in accordance with embodiments can prevent an unwanted lens bridge between neighboring microlenses by a step of convex region 600 and concave region 800. Planarization layer 250 can be formed of an organic material such as a photoresist type and the like. Alternatively, planarization layer 250 can be formed of inorganic material such as a tetra ethyl ortho silicate-based (TEOS) oxide film and the like.

Color filter layer 300 can include a red color filter layer, a green color filter layer, and a blue color filter layer so as to correspond to convex region 600 and concave region 800. The boundary between convex region 600 and concave region 800 can conform to the boundary of the red color filter layer, the green color filter layer, and the blue color filter layer. In other words, planarization layer 250 in accordance with embodiments can have convex region 600 and concave region 800 provided in a checker board pattern.

It is preferable that convex region 600 and concave region 800 be formed on each color filter layer 300 pattern in the same manner and microlens 500 can be formed on and/or over convex region 600 and concave region 800 in the same manner.

Microlens 500 can be formed to correspond to the uppermost surface of photodiode 400 of color filter layer 300 to focus light form objects on and/or over photodiode 300. Microlenses 500 can be composed of an insulating material capable of transmitting light, having at least one of photoresist and insulation properties, and capable of controlling the thickness of insulating layer 200 and planarization layer 250 to change the focal length of microlens 500.

Figure 5A:
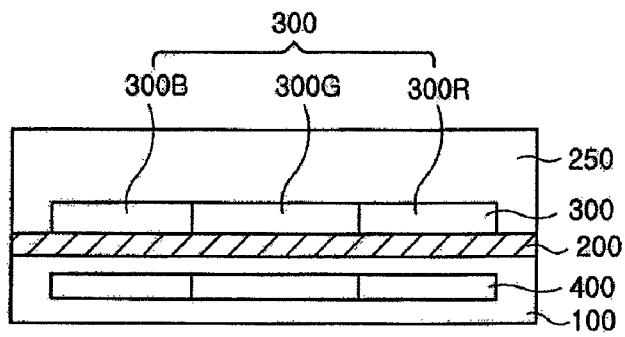

As illustrated in example FIG. 5A, a method of forming a microlens can include forming a plurality if photodiodes 400 by selectively implanting ion impurities in a photodiode region of semiconductor substrate 100. Photodiodes 400 can include red, green and blue photodiodes 400 in the photodiode region for sensing red (R), green (G), and blue (B) light. Insulating layer 200 can then be formed on and/or over semiconductor substrate 100.

Color filter layers 300 including red color filter 300R, green color filter 300G and blue color filter 300B can then be formed on and/or over insulating layer 200. Color filter layers 300 can be formed in a mosaic form and correspond in color to each of the red, green and blue photodiodes 400. Specifically, red color filter layer 300R can be formed at a position corresponding to the red photodiode by coating a red photoresist on and/or over the entire surface including blue color filter layer 300B and patterning it using a photoetching process. Green color filter layer 300G can be formed at a position corresponding to the green photodiode by coating a green photoresist on the entire surface including red color filter layer 300R and blue color filter layer 300B and patterning it using a photoetching process. Finally, blue color filter layer 300B can be formed at a position corresponding to blue photodiode 400 by coating a blue photoresist and patterning it using a photoetching process.

Planarization layer 250 may then be formed by one of coating an organic material such as a photoresist type and the like and depositing an inorganic material such as a tetra ortho silicate (TEOS)-based oxide, nitride and the like on and/or over insulating layer 200 including color filter layers 300. The thickness of microlens 500 can be controlled in accordance with the thickness of planarization layer 250 so that the focal length can be varied.

Figure 5B:
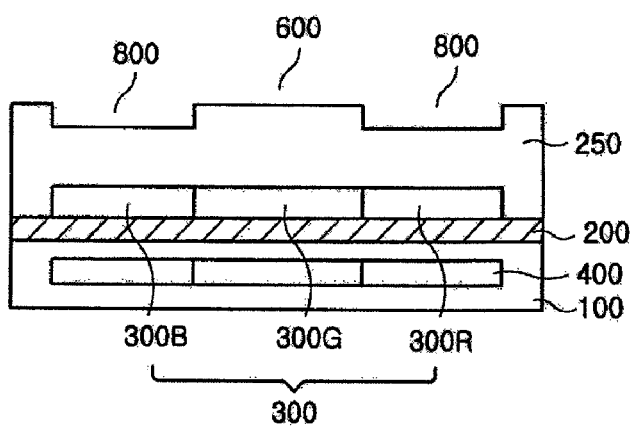

As illustrated in example FIG. 5B, convex region 600 and concave region 800 can be formed in an alternating pattern by selectively patterning the uppermost surface of planarization layer 250 using exposure and development processes. Convex region 600 and concave region 800 can be repeatedly arranged in a pixel period and formed to correspond to a respective one of red color filter layer 300R, green color filter layer 300G, and blue color filter layer 300B.

If planarization layer 250 is composed of an organic material, an exposure mask can be covered on and/or over planarization layer 250 and only the uppermost surface of planarization layer 250 can be exposed for a predetermined time and the exposed planarization layer 250 can be developed to pattern planarization layer 250 to form convex region 600 and concave region 800.

If planarization layer 250 is composed of an inorganic material such as an oxide, nitride and the like, a photoresist can be coated on and/or over planarization layer 250 and a photoetching process can be applied thereto to form convex region 600 and concave region 800. More particularly, forming convex region 600 and concave region 800 can include steps of forming the photoresist pattern by coating the photoresist on and/or over planarization layer 250 and patterning it; forming convex region 600 and concave region 800 by patterning planarization layer 250 using the photoresist pattern as the mask; and then striping the photoresist pattern.

The method of forming planarization layer 250 can be different according to the device structure. For example, in an image sensor structure of forming color filter layer 300 in a mosaic with an organic material, a thin film deposition method using a low-temperature oxidation method, etch and the like can be used.

On the other hand, in an image sensor structure including vertical array type color filter layers and a planarization layer composed of inorganic material such as SiN, a thin film can be deposited using a general D-TEOS, etc.

Figure 5C:
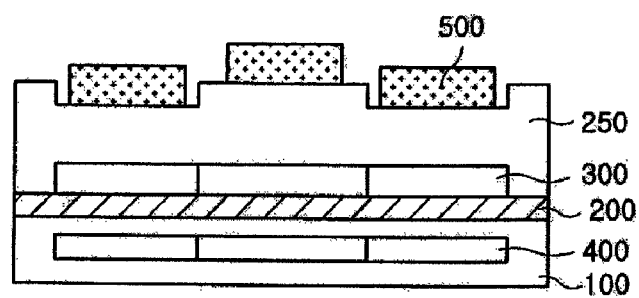

As illustrated in example FIG. 5C, a plurality of microlenses 500 formed by coating material having insulation and light transmission characteristics on and/or over the entire surface of planarization layer 250 including convex region 600 and concave region 800. Microlenses 500 can be formed in a trapezoidal shape on and/or over convex region 600 and concave region 800 by patterning the coated material using a photoetching process.

Figure 5D:
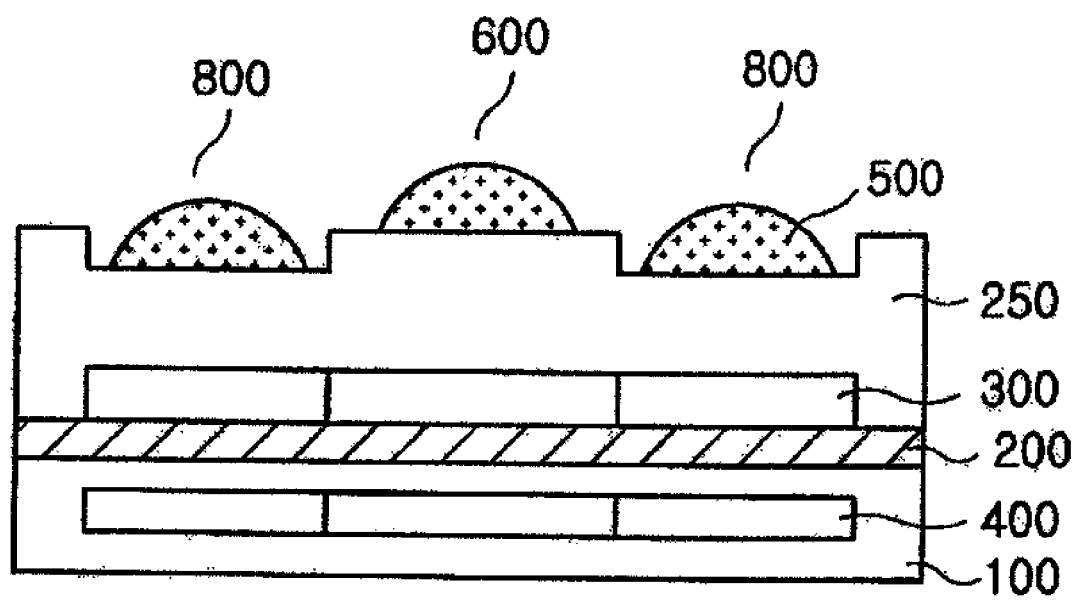

As illustrated in example FIG. 5D, microlens 500 can then be heated to a melting point and then reflowed so that their upper edges are rounded, thereby completing a predetermined pattern of microlenses 500. In the reflow process, since there is a step between convex region 600 and concave region 800, there is no risk of formation of a lens bridge between neighboring microlenses 500.

Figure 6A:
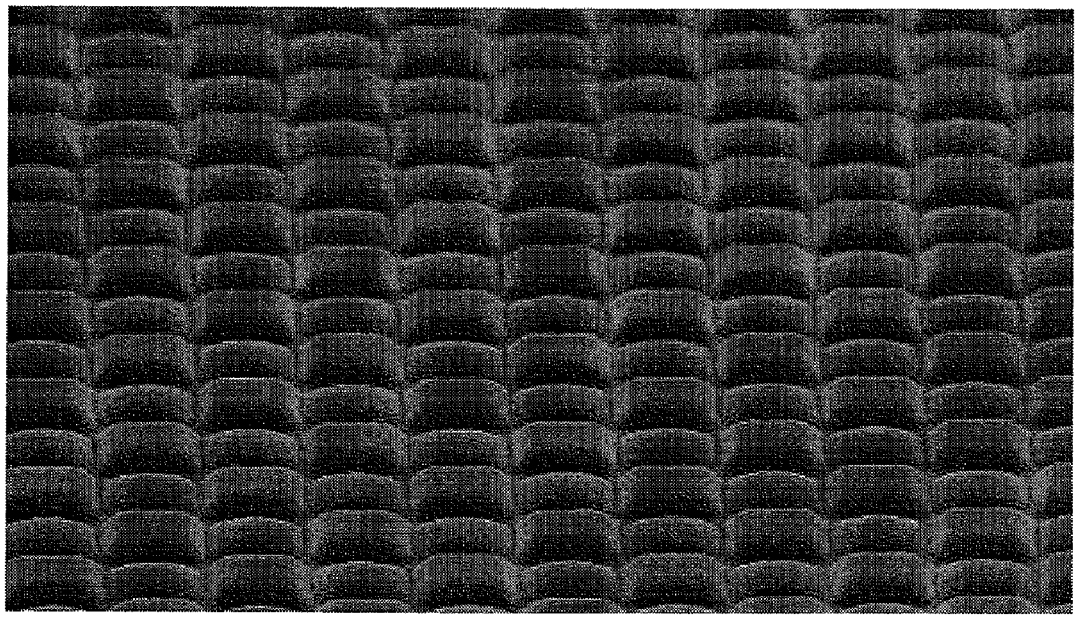
Figure 6B:
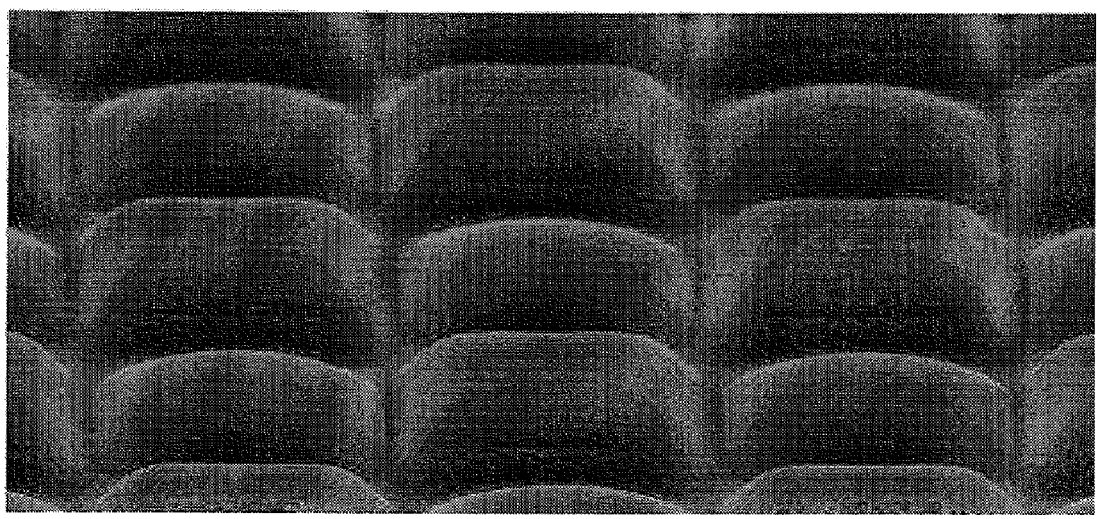

As illustrated in example FIGS. 6A and 6B, cross-sectional SEM images showing process results implementing a zero-gap between microlenses formed in accordance with embodiments by forming a planarization layer having a convex region and a concave region and then forming the microlenses thereon and/or thereover. The SEM images in a case where an organic material such as a photoresist type is used as the planarization layer, whereby it can be confirmed that a lens bridge is not formed between neighboring microlenses.

Figure 7:
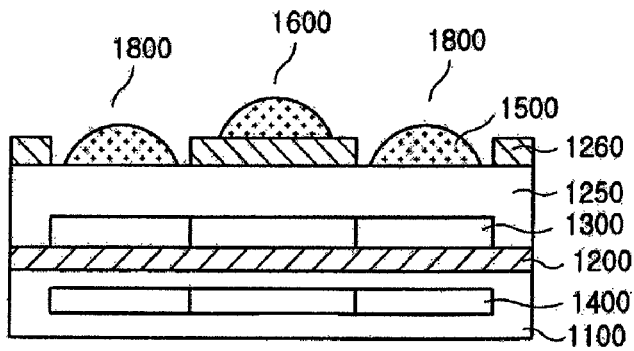

As illustrated in example FIG. 7, an image sensor in accordance with embodiments can include a plurality of photodiodes 1400 formed in semiconductor substrate 1100. Insulating layer 1200 can then be formed on and/or over semiconductor substrate 1100. Color filter layers 1300 can then be formed on and/or over insulating layer 1200 to correspond to each of the plurality of photodiodes 400. Color filter layers 1300 can include red (R), blue (B), and green (G) and alternatively formed in a mosaic form.

First planarization layer 1250 formed of an organic film or an inorganic film can then be formed over the entire surface of insulating layer 1200 including color filter layers 1300. Second planarization layer 1260 composed of a different hydrophilic material from first planarization layer 1250 can then be formed on and/or over first planarization layer 1250. For instance, if first planarization layer 1250 is composed of a hydrophilic material, second planarization layer 1260 can be formed of a hydrophobic material. On the other hand, if first planarization layer 1250 is composed of a hydrophobic material, second planarization layer 1260 can be composed of a hydrophilic material.

The uppermost surface of second planarization layer 1260 can include a plurality of convex regions 1600 and concave regions 1800. In order to form the concave regions and the convex regions, second planarization layer 1260 composed of an organic material (i.e., a hydrophobic material) can be patterned. Second planarization layer 1260 can be repeatedly arranged in a pixel period such convex region 1600 is formed on second planarization layer 1260 while concave region 1800 is formed on a region of first planarization layer 1250 where second planarization layer 1260 is removed.

Accordingly, when first planarization layer 1250 is composed of a hydrophobic material, and thus second planarization layer 1260 is composed of a hydrophilic material, concave region 1800 is composed of a hydrophobic material (by way of second planarization layer 1260) and convex region 1600 is composed of a hydrophilic material (by way of second planarization layer 1260).

Consequently, the hydrophilic surface and the hydrophobic surface can be repeatedly arranged every other pixel so that in the reflow process of the microlens, the force reflowing the microlens can be controlled using the surface tension of the hydrophilic surface and the hydrophobic surface to prevent formation of a lens bridge.

Color filter layer 1300 includes a red color filter layer, a green color filter layer, and a blue color filter layer, and each of convex region 1600 and concave region 1800 corresponds to each of the red color filter layer, green color filter layer and blue color filter layer. The boundary between convex regions 1600 and concave regions 1800 can correspond to the boundary between the red color filter layer, green color filter layer and blue color filter layer. In accordance with embodiments, convex regions 1600 and concave regions 1800 may be formed in a checkerboard configuration where the hydrophobic surface and the hydrophilic surface are repeatedly arranged.

It is preferable that convex regions 1600 and concave regions 1800 formed on and/or over each color filter layer pattern can be formed to be same to each other and microlens 1500 formed in convex regions 1600 and microlenses 1500 formed in concave region 1800 are formed in the same manner.

Microlens 1500 can be formed to correspond to the uppermost surface of photodiode 1400 of color filter layer 1300 to focus light form objects on photodiode 1300. Microlens 1500 can be composed of a material that exhibits good insulating, light transmission and photoresist properties. Microlens 1500 can be composed of a material that can control the thickness of insulating layer 1200 and first planarization layer 1250 and second planarization layer 1260 to change the focal length of microlens 1500.

Figure 8A:
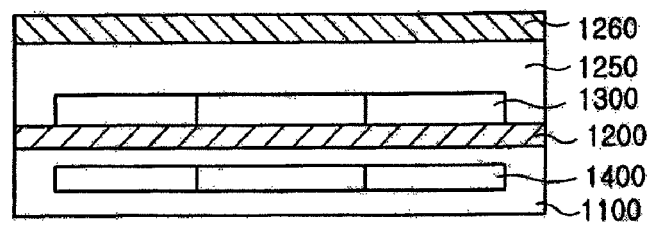

As illustrated in example FIG. 8A, a method of forming a image sensor in accordance with embodiments can include forming photodiode 1400 in a photodiode region of semiconductor substrate 1100 by selectively implanting impurity ions. Photodiode 1400 can be include red, green and blue photodiode 1400 for sensing the red (R), green (G), and blue (B) light.

Insulating layer 1200 can then be formed on and/or over semiconductor substrate 1100. Red, green and blue color filter layers 1300 can then be formed on and/or over insulating layer 1200 in a mosaic form and can correspond to each of the red, green and blue photodiodes 1400 in color.

First planarization layer 1250 and second planarization layer 1260 can be sequentially formed on and/or over insulating layer 1200 including color filter layers 1300. First planarization layer 1250 and second planarization layer 1260 can be sequentially formed by coating an organic material such as a photoresist type, etc., or depositing an inorganic material such as tetra ortho silicate (TEOS)-based oxide, nitride, etc., on and/or over the entire surface including color filter layers 1300.

First planarization layer 1250 and the second planarization layer 1260 can be formed of different materials in hydrophilic property. That is, when first planarization layer 1250 is hydrophilic, second planarization layer 1260 is formed of hydrophilic material. On the other hand, when first planarization layer 1250 is hydrophobic, second planarization layer 1260 is formed of hydrophilic material.

In order to form convex regions 1600 and concave regions 1800, second planarization layer 1260 can be patterned so that second planarization layer 1260 is formed of organic material such as a photoresistive-type (i.e., a hydrophobic material), in which case first planarization layer 1250 is formed of hydrophilic material.

Figure 8B:
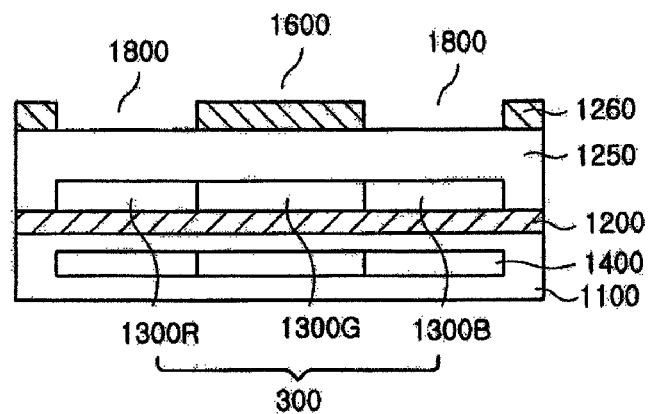

As illustrated in example FIG. 8B, convex regions 1800 repeatedly arranged in a pixel period can be formed by patterning second planarization layer 1260 using a photoetching process.

The remaining portion of second planarization layer 1260 can be a convex region 1600 and the portion of the exposed first planarization layer 1250 where second planarization layer 1260 has been removed can serve as concave region 1800.

Convex regions 1600 and concave regions 1800 can have a checkerboard configuration and can be repeatedly arranged and formed to correspond to red color filter layer 1300R, green color filter layer 1300G, and blue color filter layer 1300B. When first planarization layer 1250 is formed of hydrophilic material and second planarization layer 1260 is formed of hydrophobic material, concave region 1800 is a hydrophilic region by way of first planarization layer 1250 and convex region 1600 is a hydrophobic region by way of second planarization layer 1260.

Consequently, the hydrophilic surface and the hydrophobic surface are repeatedly arranged every other pixel so that in the reflow process of microlens 1500, the force reflowing microlens 1500 can be controlled using the surface tension of the hydrophilic surface and the hydrophobic surface so that a lens bridge can be more certainly prevented.

Figure 8C:
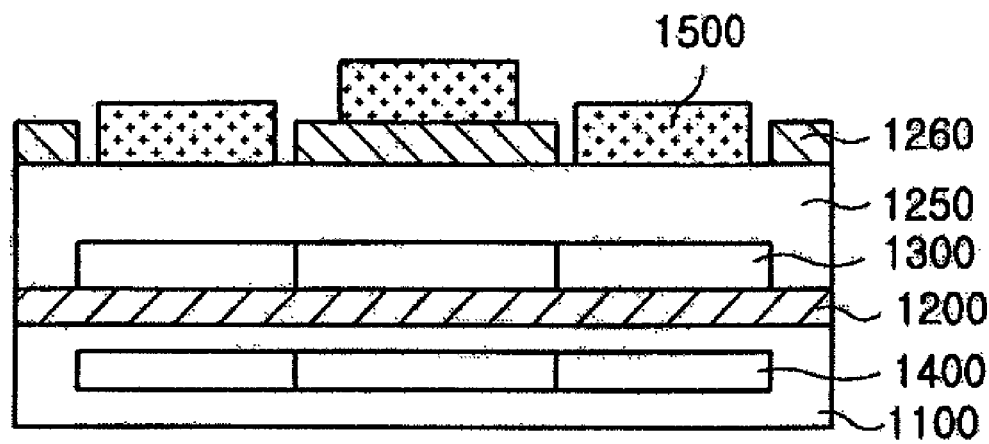

As illustrated in example FIG. 8C, a plurality of microlenses 1500 in a trapezoidal shape can then be formed by coating material having good insulation, light transmission qualities on and/or over the entire surface including convex regions 1600 and concave regions 1800 and patterning microlens 1500 using a photoetching process. At this time, a microlens 1500 can be formed on and/or over convex regions 1600 and concave regions 1800.

Figure 8D:
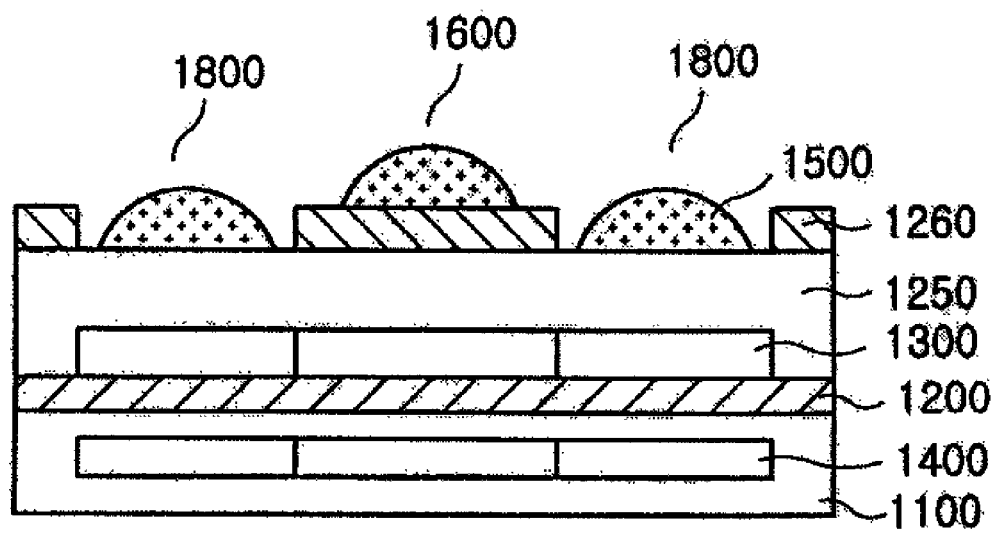

As illustrated in example FIG. 8D, microlens 1500 can then be heated to a melting point and then reflowed so that the their upper edges are rounded, thereby completing a predetermined pattern of microlenses 1500 formed in convex regions 1600 and concave regions 1800.

The reflow process of microlens 1500 can serve to prevent formation of a lens bridge connecting neighboring microlenses 1500 due to the difference in a step between the concave region 1800 and the difference in the hydrophilic property of the convex region 1600 and the concave 1800 region.

The image sensor and method of manufacturing the same in accordance with embodiments can be advantageous in least the following manner. First, the planarization layer has the convex regions and concave regions repeatedly arranged in a pixel period. Accordingly, in the reflow process of the microlens for making the upper surface of the patterned microlens a curved surface, the lens bridge connecting neighboring microlenses is not formed due to the step between the concave region and convex region of the planarization layer(s).

Second, the planarization layer having convex regions and concave regions in a checkerboard configuration that the hydrophobic surface and the hydrophilic surface are repeatedly arranged in a pixel period. As a result, the hydrophobic surface and the hydrophilic surface are repeatedly arranged so that in the reflow process of the microlens, force that the microlens is reflowed can be controlled using the surface tension of the hydrophobic surface and the hydrophilic surface. Therefore, formation of a lens bridge can be prevented.

Third, although the microlens can be excessively reflowed, there is no risk that a lens bridge is formed due to the step of the concave and convex regions of the planarization layer(s) so that the deterioration of image quality such as a bending phenomenon, etc. can be prevented.

Although embodiments have been described herein, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A method comprising:
   providing a semiconductor substrate having a plurality of photodiodes formed therein;
   forming an insulating layer over the semiconductor substrate;
   forming a color filter layer over the insulating layer and corresponding to the plurality of photodiodes;
   forming a plurality of concave regions and a plurality of convex regions repeatedly arranged in a pixel period over the color filter layer; forming a planarization layer comprising at least one of an organic film and an inorganic film and having the plurality of concave regions and convex regions;
   forming a plurality of microlenses over the convex regions and the concave regions.

2. A method comprising:
   providing a semiconductor substrate having a plurality of photodiodes formed therein;
   forming an insulating layer over the semiconductor substrate;
   forming a color filter layer over the insulating layer and corresponding to the plurality of photodiodes;
   sequentially forming a first planarization layer over the color filter layer and a second planarization layer over the first planarization layer, wherein the first planarization layer and the second planarization layer are composed of one of an organic material and an inorganic material;
   patterning the second planarization layer to expose regions of the uppermost surface of the first planarization layer, wherein each one of the exposed regions of the uppermost surface of the first planarization layer includes a concave region and the uppermost surface of the patterned second planarization layer includes a convex region; and then
   forming a microlens over each one of the convex region and the concave region.

3. The method of claim 2, wherein the plurality of photodiodes comprises a red photodiode, a green photodiode and a blue photodiode.

4. The method of claim 3, wherein the color filter layer comprises a red color filter, a green color filter and a blue color filter corresponding spatially to a respective one of the photodiodes with respect to color.

5. The method of claim 3, wherein each one of the concave regions and convex regions correspond spatially to a respective red color filter, green color filter and blue color filter.

6. The method of claim 3, wherein the concave regions is composed of a material different from that of the concave regions.

7. The method of claim 3, wherein the concave regions is composed of a hydrophilic material and the convex regions is composed of a hydrophobic material.

8. The method of claim 3, wherein the convex regions is composed of a hydrophilic material and the concave regions is composed of a hydrophobic material.

9. The method of claim 7, wherein the inorganic material comprises one of a nitride film and a tetra ethyl ortho silicate-based oxide film.

10. The method of claim 7, wherein the organic material comprises a photoresistive film.

11. The method of claim 2, wherein the second planarization layer is composed of a material different from that of the first planarization layer.

12. The method of claim 2, wherein the first planarization layer is composed of a hydrophilic material and the second planarization layer is composed of a hydrophobic material.

13. The method of claim 2, wherein the first planarization layer is composed of a hydrophobic material and the second planarization layer is composed of a hydrophilic material.

14. The method of claim 2, wherein the microlenses are composed of a material exhibiting insulating, light transmission and photoresist properties.

15. An apparatus comprising:
  a semiconductor substrate including a plurality of photodiodes;
  an insulation layer formed over the semiconductor substrate;
  a color filter layer formed over the insulation layer;
  a planarization layer having a plurality of alternating concave regions and convex regions in an uppermost surface thereof formed over the color filter layer; and
  a plurality of microlens formed over the concave regions and the convex regions, wherein the planarization layer comprises at least one of an organic film and an inorganic film.

16. The apparatus of claim 15, wherein the inorganic film comprises one of a nitride film and a tetra ethyl ortho silicate-based oxide film.

17. The apparatus of claim 15, wherein the organic film comprises a photoresistive film.

18. The apparatus of claim 15, wherein the color filter layer comprises a red color filter layer, a green color filter layer, and a blue color filter layer, and the concave regions and the convex regions are arranged to correspond to each of the red color filter layer, the green color filter layer and the blue color filter layer.

* * * * *